United States Patent
Ricciuti

(10) Patent No.: US 10,151,798 B2
(45) Date of Patent: Dec. 11, 2018

(54) CIRCUIT BREAKER ACCESSORY DATA COLLECTOR AND RELATED METHODS AND COMPUTER PROGRAM PRODUCTS

(71) Applicant: Eaton Intelligent Power Limited, Dublin (IE)

(72) Inventor: Anthony Thomas Ricciuti, Bethel Park, PA (US)

(73) Assignee: Eaton Intelligent Power Limited, Dublin (IE)

( * ) Notice: Subject to any disclaimer, the term of this patent is extended or adjusted under 35 U.S.C. 154(b) by 685 days.

(21) Appl. No.: 14/510,158

(22) Filed: Oct. 9, 2014

(65) Prior Publication Data
US 2016/0103180 A1  Apr. 14, 2016

(51) Int. Cl.
*G01R 31/327* (2006.01)
(52) U.S. Cl.
CPC .............................. *G01R 31/3274* (2013.01)
(58) Field of Classification Search
CPC ...... G01R 31/3274; G05D 17/02; B64G 4/00; B25B 21/00; B25B 23/147; B25F 5/00
USPC ........ 702/57, 60, 64, 65; 700/168, 286, 291, 700/297, 295
See application file for complete search history.

(56) References Cited

U.S. PATENT DOCUMENTS

| | | | | |
|---|---|---|---|---|
| 5,903,462 A | * | 5/1999 | Wagner | G05D 17/02 318/490 |
| 6,426,634 B1 | * | 7/2002 | Clunn | H02H 3/044 324/522 |
| 7,945,401 B2 | * | 5/2011 | Bowdry | G01D 4/004 700/22 |
| 8,315,742 B2 | * | 11/2012 | Patel | H02J 3/00 700/286 |
| 8,718,968 B2 | * | 5/2014 | Poeltl | G01R 31/3274 702/127 |
| 9,086,447 B1 | * | 7/2015 | Ledbetter, III | G01R 31/2827 |
| 9,217,775 B2 | * | 12/2015 | Mousavi | G01R 31/3274 |
| 2003/0220719 A1 | * | 11/2003 | Jiang | G06F 1/12 700/286 |
| 2012/0120536 A1 | * | 5/2012 | Rivers, Jr. | H02J 13/0055 361/93.2 |
| 2013/0275813 A1 | * | 10/2013 | Loganathan | G05B 23/0229 714/47.1 |
| 2014/0278179 A1 | * | 9/2014 | Dougherty | H02H 3/006 702/85 |

* cited by examiner

Primary Examiner — Manuel L Barbee
Assistant Examiner — Raymond Nimox
(74) Attorney, Agent, or Firm — Myers Bigel, P.A.

(57) ABSTRACT

Accessory data collectors coupled to a switch-gear of a power system including at least one circuit breaker are provided. The data collector includes a sensor array configured to sense parameters associated with at least one accessory coupled to the at least one circuit breaker; and data storage configured to store the sensed parameters associated with the at least one accessory for a plurality of operational cycles of the at least one circuit breaker. Related methods and computer program products are also provided.

17 Claims, 4 Drawing Sheets

CIRCUIT BREAKER ACCESSORY DATA COLLECTOR AND RELATED METHODS AND COMPUTER PROGRAM PRODUCTS

FIELD

The inventive concept relates generally to circuit breakers and, more particularly, to use of accessories with circuit breakers.

BACKGROUND

A circuit breaker is an electrical distribution device that is used to control the flow of electrical current into a circuit. The circuit breaker is generally configured to open under abnormal operating conditions, such as a short circuit. There are different types of circuit breakers. Medium voltage vacuum circuit breakers provide centralized control and protection of medium voltage power equipment and circuits in utility, industrial, commercial, mining and marine installations involving generators, motors, feeder circuits, and transmission and distribution lines. These circuit breakers may use a variety of accessory devices including, but not limited to, electric motors for charging, electric coils or solenoids for opening and closing operations, and undervoltage release electric coils or solenoids. These accessory devices have operational specification limits for voltage, current, and the amount of time energized. In order to analyze field failures of these accessory devices, it is important to know if these devices were exposed to electrical inputs within their operational specification limits to separate manufacturing defects from application errors.

SUMMARY

Some embodiments of the inventive concept provide an accessory data collector coupled to a switch-gear of a power system including at least one circuit breaker. The data collector includes a sensor array configured to sense parameters associated with at least one accessory coupled to the at least one circuit breaker; and data storage configured to store the sensed parameters associated with the at least one accessory for a plurality of operational cycles of the at least one circuit breaker.

In further embodiments, the data collector may couple the switch-gear through a plurality of terminal blocks positioned between a secondary control voltage terminal connected to the at least once circuit breaker and mating secondary control voltage terminal connected to the switch-gear.

In still further embodiments, the plurality of terminal blocks may be interchangeable for at least one of different circuit breaker frames and connection schematics.

In some embodiments, the data collector may include a power source for the data collector. The power source may be one of an external power source and an internal power source within a housing of the data collector.

In further embodiments, the data storage may include one of internal storage within the housing of the data collector, external flash memory and a universal serial bus (USB).

In still further embodiments, the at least one circuit breaker may be in a test mode when data is the sensor array is sensing parameters associated with the at least one accessory.

In some embodiments, the sensed parameters may include electrical characteristics associated with the at least one accessory device, the electrical characteristics including at least one of voltage, current and resistance associated with the at least one accessory device. The stored data may be analyzed to provide time values of application and changing rates of the electrical characteristics over the plurality of operations cycles of the at least one circuit breaker.

Further embodiments of the present inventive concept provide methods of collecting data for circuit breaker accessories using an accessory data collector coupled to a switch-gear of a power system including at least one circuit breaker. The methods include sensing parameters associated with at least one accessory coupled to the at least one circuit breaker; and storing the sensed parameters associated with the at least one accessory for a plurality of operational cycles of the at least one circuit breaker. The at least one of the sensing and storing are performed by at least one processor of the data collector.

Still further embodiments provide computer program products for collecting data for circuit breaker accessories using an accessory data collector coupled to a switch-gear of a power system including at least one circuit breaker. The computer program product includes a non-transitory computer readable storage medium having computer readable program code embodied in the medium. The computer readable program code includes computer readable program code to sense parameters associated with at least one accessory coupled to the at least one circuit breaker; and computer readable program code to store the sensed parameters associated with the at least one accessory for a plurality of operational cycles of the at least one circuit breaker.

DETAILED DESCRIPTION

Figure 1:
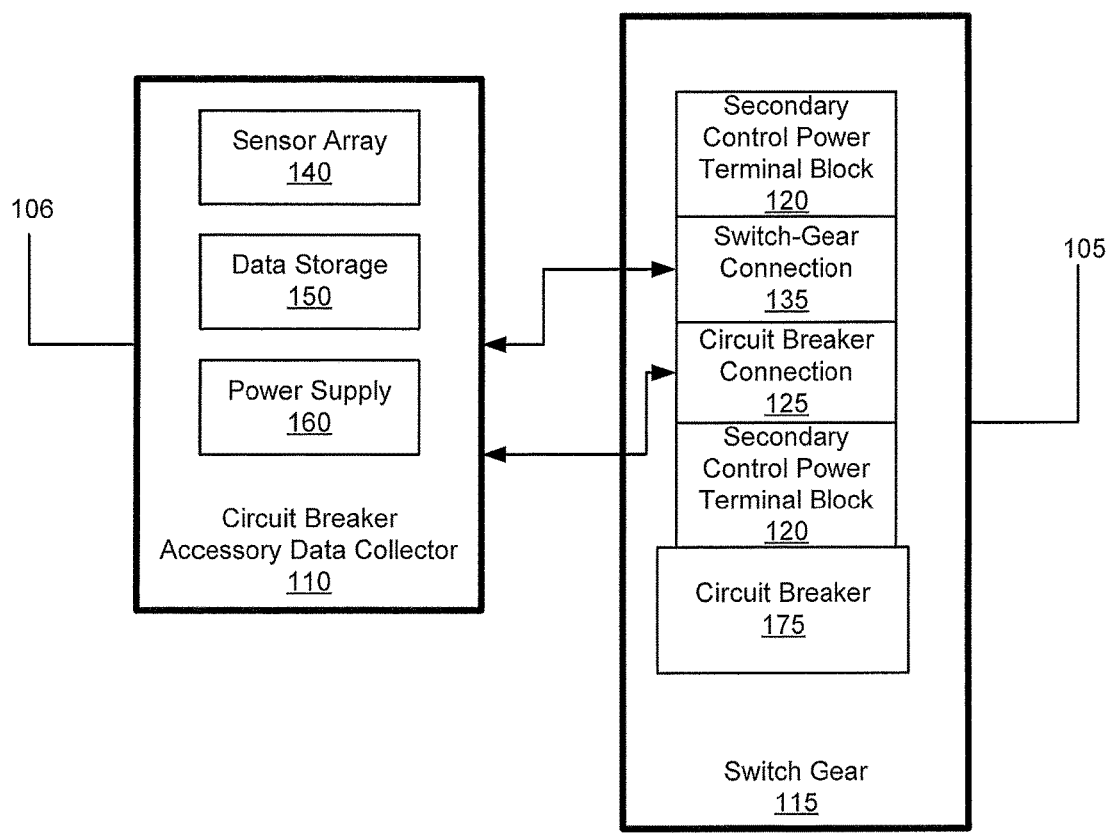
FIG. 1 is a block diagram of a power system including a data collector and a switch-gear in accordance with some embodiments of the present inventive concept.

Specific example embodiments of the inventive concept now will be described with reference to the accompanying drawings. This inventive concept may, however, be embodied in many different forms and should not be construed as limited to the embodiments set forth herein; rather, these embodiments are provided so that this disclosure will be thorough and complete, and will fully convey the scope of the inventive concept to those skilled in the art. In the drawings, like numbers refer to like elements. It will be understood that when an element is referred to as being "connected" or "coupled" to another element, it can be directly connected or coupled to the other element or intervening elements may be present. As used herein the term "and/or" includes any and all combinations of one or more of the associated listed items.

The terminology used herein is for the purpose of describing particular embodiments only and is not intended to be limiting of the inventive concept. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

As discussed above, medium voltage vacuum circuit breakers provide centralized control and protection of medium voltage power equipment and circuits in utility, industrial, commercial, mining and marine installations involving generators, motors, feeder circuits, and transmission and distribution lines. These circuit breakers may use a variety of accessory devices including, but not limited to, electric motors for charging, electric coils or solenoids for opening and closing operations, and under-voltage release electric coils or solenoids. These accessory devices have operational specification limits for voltage, current, and the amount of time energized. In order to analyze field failures of these accessory devices, it is important to know if these devices were exposed to electrical inputs within their operational specification limits to separate manufacturing defects from application errors. In other words, sometime an accessory may fail because it is exposed to parameters outside of its limits. Thus, the failure would not be due to a manufacturing defect, but would be a result of misuse.

Accordingly, some embodiments of the present inventive concept provide a data collector device configured to connect to the switch-gear or circuit breaker. Electric switch-gear is well known to those of skill in the art. The switch-gear may be configured within a housing with at least one compartment provided with a door and electrical conductors adapted for connection to a load. Medium Voltage Switch-gear provides centralized control and protection of medium-voltage power equipment and circuits in industrial, commercial, and utility installations involving generators, motors, feeder circuits, and transmission and distribution lines.

The data collector device in accordance with embodiments discussed herein may be configured to measure electrical characteristics, for example, voltage, current and resistance, for the accessory. The data collector may also record time values for the application associated with the accessory and changing rates of electrical characteristics over an extended period of time. As used herein, "an extended period of time" refers to more than one operation cycle of the circuit breaker. The recorded information may be stored. Once recorded and stored the data may be analyzed to provide information with respect to application errors and manufacturing defects. The data may be analyzed using an external computer or other equipment as will be discussed further below with respect to FIGS. 1 to 4.

Referring now to FIG. 1, a block diagram illustrating a circuit breaker accessory data collector 110 (hereinafter "data collector 110") coupled to a switch-gear 115 in accordance with some embodiments of the present inventive concept will be discussed. It will be understood that the block diagram of FIG. 1 is provided for discussion purposes only and that embodiments of the inventive concept are not limited to the configuration illustrated therein.

As illustrated in FIG. 1, within a housing 105, the switch-gear includes a circuit breaker 175 having secondary control power terminal blocks 120 mounted thereon. As illustrated the switch-gear connection 135 and the circuit breaker connection 125 in accordance with embodiments of the present inventive concept are coupled to the terminal blocks 120. Although only a single circuit breaker 175 is illustrated in the switch-gear housing 105 embodiments of the present inventive are not limited to this configuration.

In an electric power system, switch-gear is the combination of electrical disconnect switches, fuses or circuit breakers used to control, protect and isolate electrical equipment. Switch-gear is used both to de-energize equipment to allow work to be done and to clear faults downstream. Typically, this type of equipment is directly linked to the reliability of the electricity supply. The electric current interruption device or switching device is called a circuit breaker 175 within the switch-gear 115. The circuit breaker 175 can be operated manually as when required and it is also operated during over electric current and short circuit or any other faults in the system by sensing the abnormality of system. The circuit breaker 175 senses the faulty condition of system through a protection relay and this relay is again actuated by faulty signal normally comes from current transformer or voltage transformer.

In addition to a circuit breaker 175, a switch-gear may also include, for example, a current transformer, a voltage transformer, a protection relay, a measuring instrument, an electrical switch, an electrical fuse, a miniature circuit breaker, a lightening arrestor or surge arrestor, an electrical isolator and/or other associated equipment. Electric switch-gear is typically used at every switching point in the electrical power system. There are various voltage levels and hence various fault levels between the generating stations and load centers. Therefore various types of switch-gear assembly are used depending upon different voltage levels of the system. Although embodiments of the present inventive concept discuss electrical switch-gear in power systems, switch-gear may also be used in industrial works, industrial projects, domestic and commercial buildings and the like without departing from the scope of the present inventive concept.

Most circuit breaker systems have common features in their operation, although details vary substantially depending on the voltage class, current rating and type of the circuit breaker. A circuit breaker 175 detects a fault condition. In low voltage circuit breakers this is usually done within the breaker enclosure. Circuit breakers for large currents or high voltages are usually arranged with protective relay pilot devices to sense a fault condition and to operate the trip opening mechanism. The trip solenoid that releases the latch is usually energized by a separate battery, although some high-voltage circuit breakers are self-contained with current transformers, protective relays and an internal control power source.

Once a fault is detected, contacts within the circuit breaker open to interrupt the circuit; some mechanically-stored energy (using something such as springs or compressed air) contained within the breaker is used to separate the contacts, although some of the energy required may be obtained from the fault current itself. Small circuit breakers may be manually operated; larger units have solenoids to trip the mechanism and electric motors to restore energy to the springs.

When a current is interrupted, an arc is generated. This arc is contained, cooled and extinguished in a controlled way, so that the gap between the contacts can again withstand the voltage in the circuit. Different circuit breakers use vacuum, air, insulating gas or oil as the medium the arc forms in. Different techniques are used to extinguish the arc including: lengthening/deflection of the arc; intensive cooling (in jet chambers); division into partial arcs; zero point quenching (contacts open at the zero current time crossing of the AC waveform, effectively breaking no load current at the time of opening. The zero crossing occurs at twice the line frequency, i.e. 100 times per second for 50 Hz and 120 times per second for 60 Hz AC); and connecting capacitors in parallel with contacts in DC circuit. Finally, once the fault condition has been cleared, the contacts can be closed again to restore power to the interrupted circuit. Circuit breakers 175 in accordance with embodiments of the present invention may be any type of circuit breaker that lends itself to a data collector 110 in accordance with embodiments discussed herein.

Referring again to FIG. 1, the data collector 110 in accordance with embodiments of the present inventive concept is coupled to the switch-gear 115 in the housing 105 a circuit breaker connection 125 and a switch-gear connection 135. Thus, the data collector 110 connects internal sensors (sensory array 140) to the circuit breaker accessory devices, for example, electric motors for charging, electric coils or solenoids for opening and closing operations, and under-voltage release electric coils or solenoids, via mating terminal blocks 125/135 between the secondary control voltage terminals (125) attached to each circuit breaker 175 and the mating secondary control voltage terminals (135) attached to the switch-gear housing 105 into which the circuit breaker 175 is intended to be installed. It will be understood that in some embodiments, the circuit breaker 175 is configured to have a secondary set of contacts to which the switch-gear connector and the circuit breaker connector can be connected.

It will be understood that the terminal blocks may be interchangeable for different circuit breaker frames or connection schematics in accordance with various embodiments of the present inventive concept.

It will be understood that the circuit breaker 175 may not be fully installed into the switch-gear 115 when the internal sensors (sensor array 140) of the data collector 110 are recording/sensing parameters with respect to the various accessories attached to the circuit breaker 175. In particular, a circuit breaker 175 has various modes of operation. For example, a circuit breaker may be (1) connected; (2) under test; (3) disconnected; and (4) removed. When the circuit breaker 175 is connected, it is fully operational and performs all the operations it is configured to do. When the circuit breaker 175 is in test mode, it performs all the operations it is configured for, but isolated from the primary circuit. When the circuit breaker 175 is disconnected, it may be in the housing, but not connected to the circuit and does not perform the configured operations. Finally, the circuit breaker 175 can be completely removed from the housing. Thus, when data is collected in accordance with embodiments discussed herein, the circuit breaker 175 may be in the test position, i.e. performing all operations it is configured for, but isolated from the primary circuit.

Referring again to FIG. 1, the switch-gear 115 is connected to the data collector 110 in accordance with embodiments of the present inventive concept. As illustrated, the data collector 110 includes a sensor array 140, data storage 150 and a power supply 160. It will be understood that elements of the data collector can be combined or more elements may be provided without departing from the scope of the present inventive concept.

As illustrated, the data collector 110 includes a housing 106 that includes the sensor array 140. The sensor array 140 is configured to measure electrical characteristics including voltage, current, and resistance associated with the accessories coupled to the circuit breaker 175. The sensor array 140 may also be configured to record time values for the application and changing rates of the electrical characteristics over an extended period of time. As discussed above, unlike conventional systems, an extended period of time includes more than one circuit breaker cycling operation.

The data may be stored in data storage 150. The data storage 150 may be predefined and may be a fixed internal storage or may be variable and dependent on the installation of, for example, a user supplied storage medium. For example, the user supplied storage medium may include a flash memory card or universal serial bus (USB) drive.

As further illustrated in FIG. 1, the data collector 110 includes a power supply 160. Although the power supply 160 is shown as being provided in the housing 106 of the data collector 110, the power supply 160 may be an internal battery or an external power supply without departing from the scope of the present inventive concept.

As discussed above, the sensor array 140 of the data collector 110 may be connected to the circuit breaker accessory devices via mating terminal blocks which may be interchangeable for different circuit breaker frames or connection schematics, between the secondary control voltage terminals attached to each circuit breaker and the mating secondary control voltage terminals attached to the switch-gear housing into which the circuit breaker is intended to be installed.

Once the information associated with the accessory devices have been recorded over time, the operational specification limits for voltage, current, and the amount of time energized may be analyzed to provide information with respect to field failures of these accessory devices. Thus, the information recorded may be used to determine if these accessory devices were, for example, exposed to electrical inputs within their operational specification limits to separate manufacturing defects from application errors.

Figure 2:
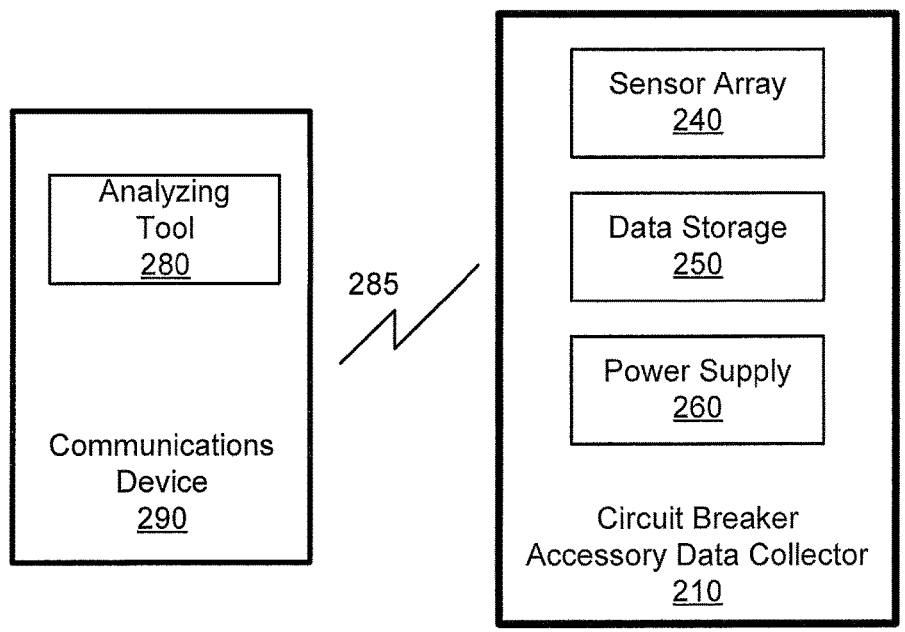
FIG. 2 a block diagram of a system including a communications device and a data collector in accordance with some embodiments of the present inventive concept.

A system that may be used to analyze the information gathered and stored by the data collector 110 (FIG. 1) is illustrated in FIG. 2. As illustrated therein, the data collector 260 including the sensor array 240, the data storage 250 and the power supply 260, is connected to a communications device 290 including an analyzing tool 280. The communications device 290 may be connected to data collector 210 using any type of connection 285, for example, wireless or wired without departing from the scope of the inventive concept.

The analyzing tool 280 may access the data storage 250 of the data collector over the connection 285 and provide information relevant to the accessory devices to allow for correction of manufacturing defects, if necessary. For example, the relevant information may include inrush current peaks, RMS current averages, resistances, voltages, duration of current flow, shapes of sinusoidal current waveforms and the like.

Figure 3:
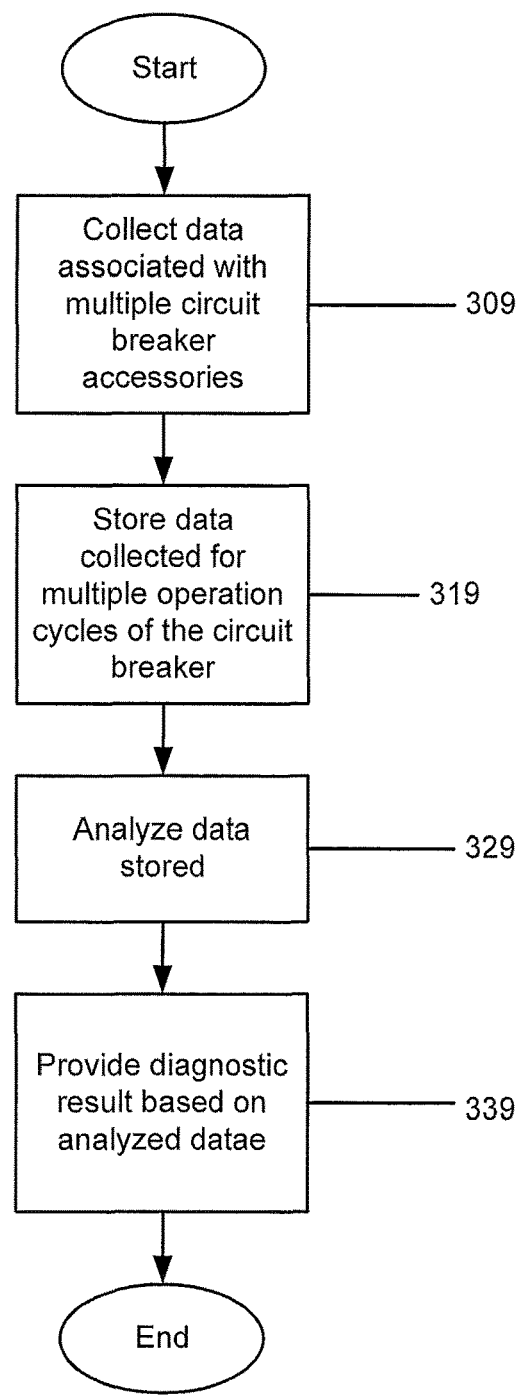
FIG. 3 is a flow chart illustrating operations of the data collector in accordance with various embodiments of the present inventive concept.

Referring now to the flowchart of FIG. 3, operations according to some embodiments of the present inventive concept will be discussed. Operations begin at block 309 by collecting data associated with various accessories coupled to the circuit breaker. This data is stored for multiple operation cycles of the circuit breaker (block 319). When an accessory malfunctions, the analyzing tool may access information related to the particular accessory from the data storage 250 and analyze the stored data (block 329). The data may be analyzed using any method known to those having skill in the art, for example, data mining techniques. Diagnostic results may be provided based on the analyzed data (block 339). It may be determined that the accessory was exposed to electrical input that is outside of the accessories acceptable parameters. Thus, instead of trying to fix the accessory device on the manufacturing end, it can be concluded that the accessory device failed due to misuse, rather than a manufacturing defect.

Thus, although conventional circuit breaker analyzers can measure and record information, the information recorded is for one individual operational cycle and is not comprehensive as the information recorded in accordance with embodiments of the present inventive concept. Thus, information provided by conventional devices may be used primarily intended for circuit breaker maintenance. Embodiments of the present inventive concept store data for an extended period of time and this data may be used for accessory diagnostics through recording of electrical operational characteristics. Accordingly, embodiments of the present inventive concept may be used to differentiate between manufacturing defects and misuse of a device.

Figure 4:
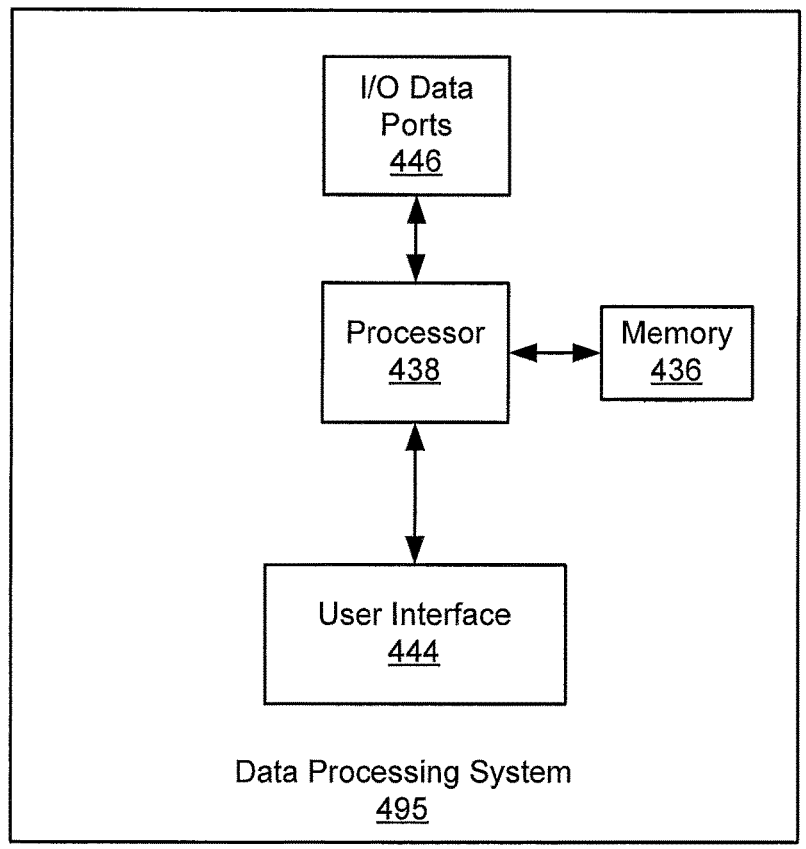
FIG. 4 is a block diagram illustrating a data processor that can be used in accordance with various embodiments of the present inventive concept.

Referring now to FIG. 4, a block diagram of a data processing system 495 that may be included in one of more of the communications device 290 and/or the data collector 110/210 in accordance with some embodiments will be discussed. As illustrated in FIG. 4, the data processing system 495 may include a user interface 444, including, for example, input device(s) such as a man machine interface (MMI) including, but not limited to a keyboard or keypad and a touch screen; a display; a speaker and/or microphone; and a memory 436 that communicate with a processor 438. The data processing system 495 may further include I/O data port(s) 446 that also communicates with the processor 438. The I/O data ports 446 can be used to transfer information between the data processing system 495 and another computer system or a network, such as an Internet server, using, for example, an Internet Protocol (IP) connection. These components may be conventional components such as those used in many conventional data processing systems, which may be configured to operate as described herein.

Example embodiments are described above with reference to block diagrams and/or flowchart illustrations of methods, devices, systems and/or computer program products. It is understood that a block of the block diagrams and/or flowchart illustrations, and combinations of blocks in the block diagrams and/or flowchart illustrations, can be implemented by computer program instructions. These computer program instructions may be provided to a processor of a general purpose computer, special purpose computer, and/or other programmable data processing apparatus to produce a machine, such that the instructions, which execute via the processor of the computer and/or other programmable data processing apparatus, create means (functionality) and/or structure for implementing the functions/acts specified in the block diagrams and/or flowchart block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the functions/acts specified in the block diagrams and/or flowchart block or blocks.

The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions/acts specified in the block diagrams and/or flowchart block or blocks.

Accordingly, example embodiments may be implemented in hardware and/or in software (including firmware, resident software, micro-code, etc.). Furthermore, example embodiments may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Computer program code for carrying out operations of data processing systems discussed herein may be written in a high-level programming language, such as Java, AJAX (Asynchronous JavaScript), C, and/or C++, for development convenience. In addition, computer program code for carrying out operations of example embodiments may also be written in other programming languages, such as, but not limited to, interpreted languages. Some modules or routines may be written in assembly language or even micro-code to enhance performance and/or memory usage. However, embodiments are not limited to a particular programming language. It will be further appreciated that the functionality of any or all of the program modules may also be implemented using discrete hardware components, one or more application specific integrated circuits (ASICs), or a field programmable gate array (FPGA), or a programmed digital signal processor, a programmed logic controller (PLC), or microcontroller.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated.

In the drawings and specification, there have been disclosed example embodiments of the inventive concept. Although specific terms are employed, they are used in a generic and descriptive sense only and not for purposes of limitation, the scope of the inventive concept being defined by the following claims.

That which is claimed:

1. An accessory data collector configured to be coupled to a switch-gear of a power system including at least one circuit breaker, the accessory data collector comprising:
    a sensor array configured to sense parameters comprising electrical characteristics associated with at least one accessory coupled to the at least one circuit breaker, wherein the sensor array is distinct from the at least one circuit breaker and is external to a housing associated with the circuit breaker;
    data storage configured to store the sensed parameters associated with the at least one accessory during a plurality of operational cycles of the at least one circuit breaker; and
    a processor coupled to the data storage, wherein the processor executes instructions to store the sensed parameters associated with the at least one accessory in the data storage during the plurality of operational cycles of the at least one circuit breaker,
    wherein the stored parameters are indicative of malfunction or failure of the at least one accessory,
    wherein the stored parameters are analyzed to provide time values of application comprising an amount of time the at least one accessory was energized and changing rates of the electrical characteristics over the plurality of operational cycles of the at least one circuit breaker,
    wherein the stored parameters are further analyzed to determine if the at least one accessory has been exposed to electrical inputs beyond operational specification limits associated with the amount of time the at least one accessory was energized to distinguish manufacturing defects of the at least one accessory from application errors associated with usage of the at least one accessory, and
    wherein the accessory data collector is configured to couple the sensor array to the at least one accessory via a plurality of mating terminal blocks between a first secondary control voltage terminal connected to the at least one circuit breaker and a second secondary control voltage terminal connected to the switch-gear.

2. The accessory data collector of claim 1, wherein the plurality of mating terminal blocks are interchangeable for at least one of different circuit breaker frames and connection schematics.

3. The accessory data collector of claim 1, further comprising a power source coupled to the accessory data collector.

4. The accessory data collector of claim 3, wherein the power source is one of an external power source and an internal power source within a housing of the accessory data collector.

5. The accessory data collector of claim 1, wherein the data storage comprises one or more of internal storage within the housing of the accessory data collector, external flash memory and a universal serial bus (USB).

6. The accessory data collector of claim 1, wherein the at least one circuit breaker is in a test mode when the sensor array is sensing parameters associated with the at least one accessory.

7. The accessory data collector of claim 1, wherein the electrical characteristics include at least one of voltage, current and resistance associated with the malfunction or failure of the at least one accessory.

8. A method of collecting data for circuit breaker accessories of a switch-gear of a power system, the method comprising:
    providing an accessory data collector comprising a sensor array and data storage, wherein the accessory data collector is configured to be coupled to the switch-gear and is external to a housing thereof;
    connecting the sensor array to at least one accessory that is coupled to the at least one circuit breaker via a plurality of mating terminal blocks between a first secondary control voltage terminal connected to the at least one circuit breaker and a second secondary control voltage terminal connected to the switch-gear;
    sensing, via the sensor array, parameters comprising electrical characteristics associated with at least one accessory coupled to the at least one circuit breaker, wherein the sensor array is distinct from the at least one circuit breaker;
    storing the sensed parameters associated with the at least one accessory in the data storage during a plurality of operational cycles of the at least one circuit breaker, wherein the stored parameters are indicative of malfunction or failure of the at least one accessory; and
    analyzing the stored parameters to provide time values of application comprising an amount of time the at least one accessory was energized and changing rates of the electrical characteristics over the plurality of operational cycles of the at least one circuit breaker;
    analyzing the stored parameters to determine if the at least one accessory has been exposed to electrical inputs beyond operational specification limits associated with the amount of time the at least one accessory was energized to distinguish manufacturing defects of the at least one accessory from application errors associated with usage of the at least one accessory,
    wherein at least one processor coupled to the data storage executes instructions to perform the storing the sensed parameters associated with the at least one accessory in the data storage during the plurality of operational cycles of the at least one circuit breaker.

9. The method of claim 8, wherein the storing further comprises storing the sensed parameters in one or more of internal storage within a housing of the accessory data collector, external flash memory and a universal serial bus (USB).

10. The method of claim 8, wherein the sensing is preceded by placing the at least one circuit breaker in a test mode for sensing parameters associated with the at least one accessory.

11. The method of claim 8, wherein the electrical characteristics include at least one of voltage, current and resistance associated with the malfunction or failure of the at least one accessory.

12. The method of claim 8, further comprising electronically providing diagnostic results for each of the at least one accessory based on the analyzed parameters.

13. A computer program product for collecting data for circuit breaker accessories using an accessory data collector configured to be coupled to a switch-gear of a power system including at least one circuit breaker, the computer program product comprising:

a non-transitory computer readable storage medium having computer readable program code embodied in the medium, the computer readable program code comprising:

computer readable program code that, when executed by one or more processors, cause the one or more processors to sense via a sensor array, parameters comprising electrical characteristics associated with at least one accessory coupled to the at least one circuit breaker, wherein the sensor array is distinct from the at least one circuit breaker and is external to a housing associated with the circuit breaker;

computer readable program code that, when executed by the one or more processors, cause the one or more processors to store the sensed parameters associated with the at least one accessory in a data storage during a plurality of operational cycles of the at least one circuit breaker, wherein the stored parameters are indicative of malfunction or failure of the at least one accessory;

computer readable program code configured to analyze that, when executed by the one or more processors, cause the one or more processors to analyze the stored parameters to provide time values of application comprising an amount of time the at least one accessory was energized and changing rates of the electrical characteristics over the plurality of operational cycles of the at least one circuit breaker; and computer readable program code that, when executed by the one or more processors, cause the one or more processors to analyze the stored parameters to determine if the at least one accessory has been exposed to electrical inputs beyond operational specification limits associated with the amount of time the at least one accessory was energized to distinguish manufacturing defects of the at least one accessory from application errors associated with usage of the at least one accessory, wherein the accessory data collector is configured to couple the sensor array to the at least one accessory via a plurality of mating terminal blocks between a first secondary control voltage terminal connected to the at least one circuit breaker and a second secondary control voltage terminal connected to the switch-gear.

14. The computer program product of claim 13, further comprising computer readable program code configured to store the sensed parameters in one or more of internal storage within a housing of the accessory data collector, external flash memory and a universal serial bus (USB).

15. The computer program product of claim 13, wherein the electrical characteristics include at least one of voltage, current and resistance associated with the malfunction or failure of the at least one accessory.

16. The computer program product of claim 13, further comprising computer readable program code configured to provide diagnostic results for each of the at least one accessory based on the analyzed parameters.

17. The accessory data collector of claim 1, wherein the sensor array is configured to sense the parameters associated with the at least one accessory device coupled to the at least one circuit breaker when the at least one circuit breaker is electrically isolated from the switch-gear.

* * * * *

UNITED STATES PATENT AND TRADEMARK OFFICE
CERTIFICATE OF CORRECTION

PATENT NO. : 10,151,798 B2
APPLICATION NO. : 14/510158
DATED : December 11, 2018
INVENTOR(S) : Anthony Thomas Ricciuti Page 1 of 1

It is certified that error appears in the above-identified patent and that said Letters Patent is hereby corrected as shown below:

In the Claims

Column 11, Claim 13, Line 24:
Please delete the phrase: "configured to analyze"

Signed and Sealed this
Second Day of April, 2019

Andrei Iancu
*Director of the United States Patent and Trademark Office*